(12) United States Patent
Jeon et al.

(10) Patent No.: US 12,087,392 B2
(45) Date of Patent: Sep. 10, 2024

(54) MEMORY INTERFACE DEVICE

(71) Applicant: ELECTRONICS AND TELECOMMUNICATIONS RESEARCH INSTITUTE, Daejeon (KR)

(72) Inventors: Young-Deuk Jeon, Sejong-si (KR); Min-Hyung Cho, Daejeon (KR); Young-Su Kwon, Daejeon (KR); Jin Ho Han, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/565,937

(22) Filed: Dec. 30, 2021

(65) Prior Publication Data

US 2022/0301603 A1    Sep. 22, 2022

(30) Foreign Application Priority Data

Mar. 16, 2021 (KR) .................. 10-2021-0034228
Dec. 29, 2021 (KR) .................. 10-2021-0190915

(51) Int. Cl.
*G11C 7/10* (2006.01)
*G11C 7/22* (2006.01)
*G11C 8/18* (2006.01)

(52) U.S. Cl.
CPC .......... *G11C 7/1084* (2013.01); *G11C 7/1057* (2013.01); *G11C 7/225* (2013.01); *G11C 8/18* (2013.01)

(58) Field of Classification Search
CPC ..... G11C 7/1084; G11C 7/1057; G11C 7/225; G11C 8/18
See application file for complete search history.

(56) References Cited

U.S. PATENT DOCUMENTS 6,950,370 B2  9/2005  Lee
7,970,960 B2  6/2011  Chun et al.
(Continued)

FOREIGN PATENT DOCUMENTS

KR     10-0533965      12/2005
KR   10-2010-0041391    4/2010
(Continued)

OTHER PUBLICATIONS

Mino Kim et al.; "A 4266Mb/s/pin LPDDR4 Interface with an Asynchronous Feedback CTLE and an Adaptive 3-step Eye Detection Algorithm for Memory Controller"; 2018; IEEE Transaction on Circuits and Systems II: Express Briefs.

*Primary Examiner* — Douglas King
(74) *Attorney, Agent, or Firm* — KILE PARK REED & HOUTTEMAN PLLC

(57) ABSTRACT

Provided is a memory interface device. A memory interface device, comprising: a DQS input buffer configured to receive input data strobe signals and output a first intermediate data strobe signal, the DQS input buffer providing a static offset; an offset control circuit configured to receive the first intermediate data strobe signal and output a second intermediate data strobe signal; and a duty adjustment buffer configured to receive the second intermediate data strobe signal and output a clean data strobe signal, wherein the offset control circuit provides a dynamic offset using the clean data strobe signal.

12 Claims, 12 Drawing Sheets

(56) References Cited

U.S. PATENT DOCUMENTS

| | | | |
|---|---|---|---|
| 8,799,529 B2 | 8/2014 | Chun et al. | |
| 8,897,083 B1 * | 11/2014 | Azizi | G11C 7/1066 |
| | | | 365/194 |
| 10,867,648 B2 | 12/2020 | Noh | |
| 2003/0217303 A1 * | 11/2003 | Chua-Eoan | G06F 5/06 |
| | | | 713/600 |
| 2009/0257294 A1 | 10/2009 | Searles et al. | |
| 2010/0090744 A1 | 4/2010 | Lee | |
| 2015/0029800 A1 | 1/2015 | Iijima et al. | |
| 2015/0206560 A1 * | 7/2015 | Kang | G11C 29/022 |
| | | | 711/105 |
| 2017/0110175 A1 | 4/2017 | Kim | |

FOREIGN PATENT DOCUMENTS

| | | |
|---|---|---|
| KR | 10-2018-0026560 | 3/2018 |
| KR | 10-2020-129588 | 11/2020 |

* cited by examiner

MEMORY INTERFACE DEVICE

CROSS-REFERENCE TO RELATED APPLICATION

This application claims priority to and the benefit of Korean Patent Application Nos. 10-2021-0034228 and 10-2021-0190915 filed in the Korean Intellectual Property Office on Mar. 16, 2021, and Dec. 29, 2021, the entire contents of which are incorporated herein by reference.

BACKGROUND OF THE DISCLOSURE

(a) Field of the Disclosure

The present disclosure relates to a memory interface device.

(b) Description of the Related Art

In many electronic devices such as smart phones, desktop computers, notebook computers, and servers, various types of memories such as a Double Data Rate (DDR), a Graphics Double Data Rate (GDDR), an Low-Power Double Data Rate (LPDDR), a High Bandwidth Memory (HBM) are used according to the purpose and characteristics of use. With the development of memory technology, data transfer rates are still increasing. For example, the LPDDR memory interface was defined as a maximum speed of 6.4 Gbps and a minimum signal size of 140 mV when moving to the LPDDR5 standard. Such a signal standard is inevitably more sensitive to noise and channel characteristics.

In order to restore a high-speed fine signal to a digital signal, an analog-based equalizer such as a continuous time linear equalizer (CTLE) as well as a digital-based decision feedback equalizer (DFE) is required. The CTLE is a circuit that amplifies high-frequency components. The CTLE is advantageous in recovering data or clock signals by compensating for high-frequency components lost in the channel, but conversely, it may generate errors such as unwanted high-frequency signals. In particular, when a data strobe signal (DQS) clock is restored and then converted to a high impedance state, an unwanted pulse may be generated.

The above information disclosed in this Background section is only for enhancement of understanding of the background of the disclosure, and therefore it may contain information that does not form the prior art that is already known in this country to a person of ordinary skill in the art.

SUMMARY OF THE DISCLOSURE

An object of the present disclosure is to provide a memory interface device capable of self-DQS cleaning capable of preventing unwanted pulses from being generated without a gate signal or DQS training.

An example embodiment of the present disclosure provides a memory interface device including: a DQS input buffer configured to receive input data strobe signals and output a first intermediate data strobe signal, the DQS input buffer providing a static offset; an offset control circuit configured to receive the first intermediate data strobe signal and output a second intermediate data strobe signal; and a duty adjustment buffer configured to receive the second intermediate data strobe signal and output a clean data strobe signal, wherein the offset control circuit provides a dynamic offset using the clean data strobe signal.

According to an embodiment of the present disclosure, the offset control circuit may include two offset control transistors being turned on according to the clean data strobe signal to change the dynamic offset.

According to an embodiment of the present disclosure, when a first clean data strobe signal of the clean data strobe signals is high, a second offset control transistor of the offset control transistors may be turned on.

According to an embodiment of the present disclosure, when a second clean data strobe signal of the clean data strobe signals is high, a first offset control transistor of the offset control transistors may be turned on.

According to an embodiment of the present disclosure, when a first input data strobe signal of the input data strobe signals is high, a second offset control transistor of the offset control transistors may be turned on.

According to an embodiment of the present disclosure, the turned on second offset control transistor may pull down a second node of the DQS input buffer to provide a positive dynamic offset.

According to an embodiment of the present disclosure, when a second input data strobe signal of the input data strobe signals is high, a first offset control transistor of the offset control transistors may be turned on.

According to an embodiment of the present disclosure, the turned-on first offset control transistor may pull down a first node of the DQS input buffer to provide a negative dynamic offset.

According to an embodiment of the present disclosure, when a first input data strobe signal of the input data strobe signals is low, and the second input data strobe signal changes from high to low, a first offset control transistor of the offset control transistors may be turned on.

According to an embodiment of the present disclosure, the static offset may be a direct current (DC) offset.

According to an embodiment of the present disclosure, the static offset may be provided by setting different sizes of symmetric transistors forming a differential structure in the DQS input buffer.

According to an embodiment of the present disclosure, the input data strobe signals may be differential data strobe signals.

According to an embodiment of the present disclosure, the duty adjustment buffer may adjust a duty error due to the static offset.

Another embodiment of the present disclosure provides a memory interface device including: a first input transistor configured to receive a first input data strobe signal; a second input transistor configured to receive a second input data strobe signal, the second input transistor forming a differential structure with the first input transistor; a first offset control transistor connected to the second input transistor through a first node, the first offset control transistor being turned on to pull down the first node when the second input data strobe signal is high; and a second offset control transistor connected to the first input transistor through a second node, the second offset control transistor being turned on to pull down the second node when the first input data strobe signal is high.

According to an embodiment of the present disclosure, the memory interface device may further include a duty adjustment buffer configured to input signals from the first node and the second node and output clean data strobe signals.

According to an embodiment of the present disclosure, the clean data strobe signals may be provided to gates of the first offset control transistor and the second offset control transistor.

According to an embodiment of the present disclosure, when a second clean data strobe signal of the clean data strobe signals is high, the first offset control transistor may be turned on.

According to an embodiment of the present disclosure, when a first clean data strobe signal of the clean data strobe signals is high, the second offset control transistor may be turned on.

According to an embodiment of the present disclosure, when the first input data strobe signal is low, and the second input data strobe signal changes from high to low, the first offset control transistor may be turned on.

According to an embodiment of the present disclosure, the sizes of the first input transistor and the second input transistor may be set to be different.

According to embodiments of the present disclosure, when a DQS signal is high impedance or DQS_t/DQS_c signals are applied to the ground, a self-DQS cleaning circuit that can restore normal DQS pulses by itself is provided so that unintentional pulses do not occur without a separate gate signal or DQS training, as a result, it is simpler than the existing DQS cleaning circuit and does not require additional correction and complicated circuitry, so it is possible to reduce area and power consumption, and to increase data transmission efficiency.

DETAILED DESCRIPTION OF THE EMBODIMENTS

Figure 1:
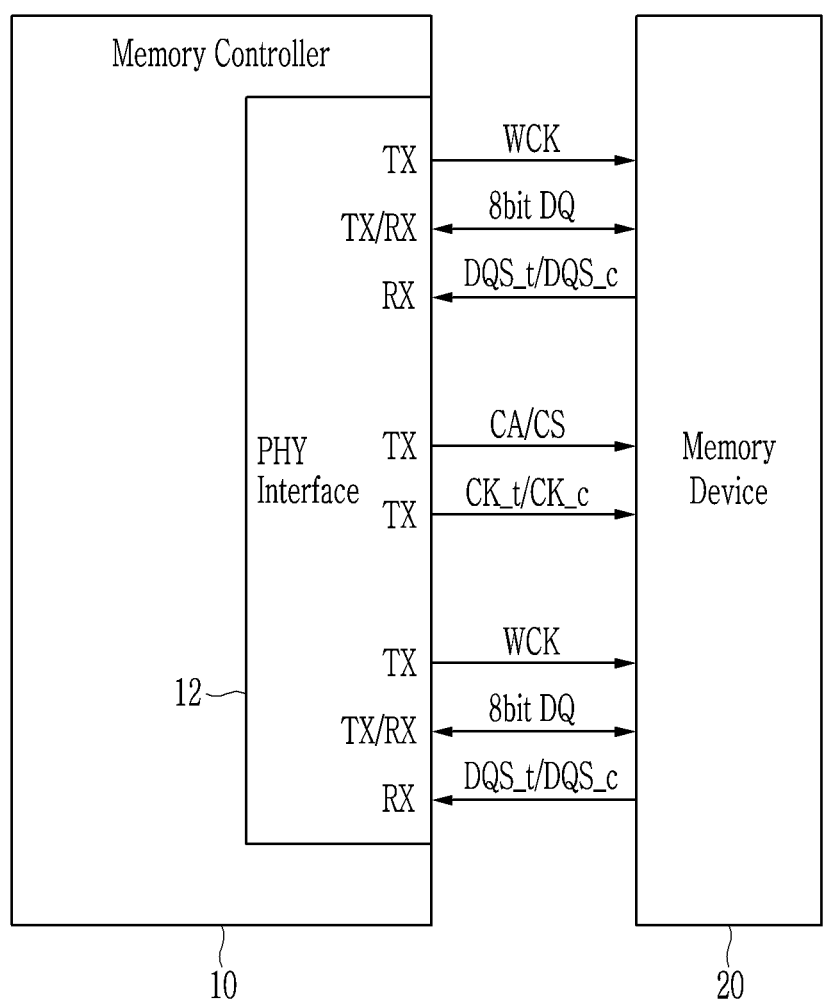
FIG. 1 illustrates a memory system according to an embodiment of the present disclosure.

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

Through the specification and the claims, unless explicitly described to the contrary, the word "comprise", and variations such as "comprises" or "comprising", will be understood to imply the inclusion of stated elements but not the exclusion of any other elements.

FIG. 1 illustrates a memory system according to an embodiment of the present disclosure.

Referring to FIG. 1, a memory system 1 according to an example embodiment may include a memory controller 10 and a memory device 20.

A PHY interface 12 of the memory controller 10 may transmit the clock CK_t/CK_c and the command address CA/chip select signal CS to the memory device 20. Meanwhile, when writing data to the memory device 20, the PHY interface 12 may transmit data to be stored as a data signal DQ to the memory device 20 together with a write clock signal WCK, and when reading data from the memory device 20, the PHY interface 12 may receive a data signal DQ and input data strobe signals DQS_t/DQS_c.

When data is read from the memory device 20, since the input data strobe signals DQS_t/DQS_c received from the memory device 20 are used as a data capture clock in the memory controller 10, they must be accurately restored. Here, the input data strobe signals DQS_t/DQS_c may be differential data strobe signals, and accordingly, the input data strobe signals DQS_t/DQS_c may be provided with opposite phases during a read operation of the memory device 20.

In the present embodiment, the memory controller 10 may be implemented as a processor, an application processor, a system on chip (SoC), or the like, but the scope of the present disclosure is not limited thereto. Meanwhile, the memory device 20 may be an LPDDR5-type DRAM mounted on smart phones, tablet computers, notebook computers, etc., but the scope of the present disclosure is not limited thereto.

Figure 2:
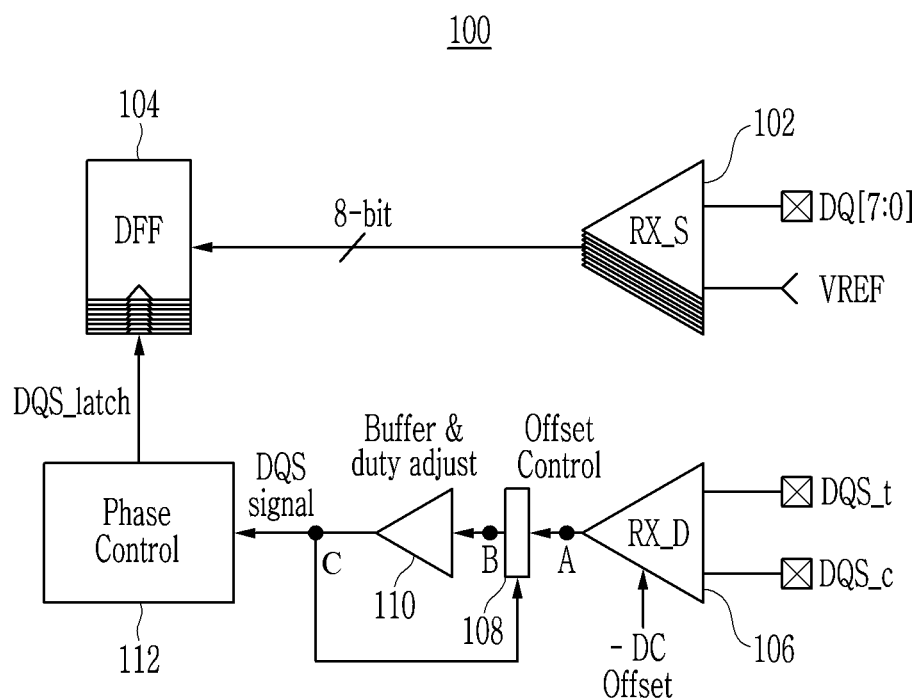
FIG. 2 illustrates a memory interface device capable of self-DQS cleaning according to an embodiment of the present disclosure.

FIG. 2 illustrates a memory interface device capable of self-DQS cleaning according to an embodiment of the present disclosure.

Referring to FIG. 2, the memory interface device 100 capable of self-DQS cleaning according to an embodiment of the present disclosure includes a data input buffer 102, a latch 104, a DQS signal input buffer 106, an offset control block 108, a duty adjustment buffer 110, and a phase control block 112.

The data input buffer 102 may include a plurality of single-ended buffers to receive the data signal DQ from the memory device 20, and the data input buffer 102 may buffer the read data and output it as parallel 8-bit data. The reference voltage signal VREF may be used as a reference signal for discriminating whether the value of the data signal DQ is 0 or 1. The value of the data signal DQ may be set to be determined to be 1 when the data signal DQ exceeds the value of the reference voltage signal VREF, and the value of the data signal DQ may be set to be determined to be 0 when the data signal DQ does not exceed the value of the reference voltage signal VREF. As described above, the data signal DQ received through the data input buffer 102 may be input to the latch 104.

The latch 104 may store the data signal DQ output from the data input buffer 102 according to the clock DQS_latch, and output it to the memory controller 100. Latch 104 may include, for example, two or more flip-flops. One of the two or more flip-flops may be synchronized with the rising edge of the clock DQS_latch to receive double data rate (DDR) data output from the data input buffer 102 and output single data rate (SDR) data. In addition, the other one of the two or more flip-flops may be synchronized with the falling edge of the clock DQS_latch to receive DDR data output from the data input buffer 102 and output SDR data.

The DQS input buffer 106 may receive the input data strobe signals DQS_t and DQS_c and output the first intermediate data strobe signal A, and may provide a static offset. Here, the static offset may be a direct current (DC) offset, and in particular, the DQS input buffer 106 may provide a negative DC offset.

The offset control circuit 108 may receive the first intermediate data strobe signal A output from the DQS input buffer 106 and output the second intermediate data strobe signal B.

The duty adjustment buffer 110 may receive the second intermediate data strobe signal B output from the offset control circuit 108 and output the clean data strobe signals DQSO_t and DQSO_c C.

The offset control circuit 108 may provide a dynamic offset using the clean data strobe signals DQSO_t and DQSO_c output from the duty adjustment buffer 110. That is, the offset control circuit 108 receives the clean data strobe signals DQSO_t and DQSO_c as feedback, and pulls down a specific node of the DQS input buffer 106 according to these signals to provide a negative dynamic offset or a positive dynamic offset. Accordingly, in order to prevent unwanted pulses from occurring, such as when transitioning to a high-impedance state after restoring the DQS clock, the offset control circuit 108 may add a negative dynamic offset to the static offset provided from the DQS input buffer 106.

Figure 3:
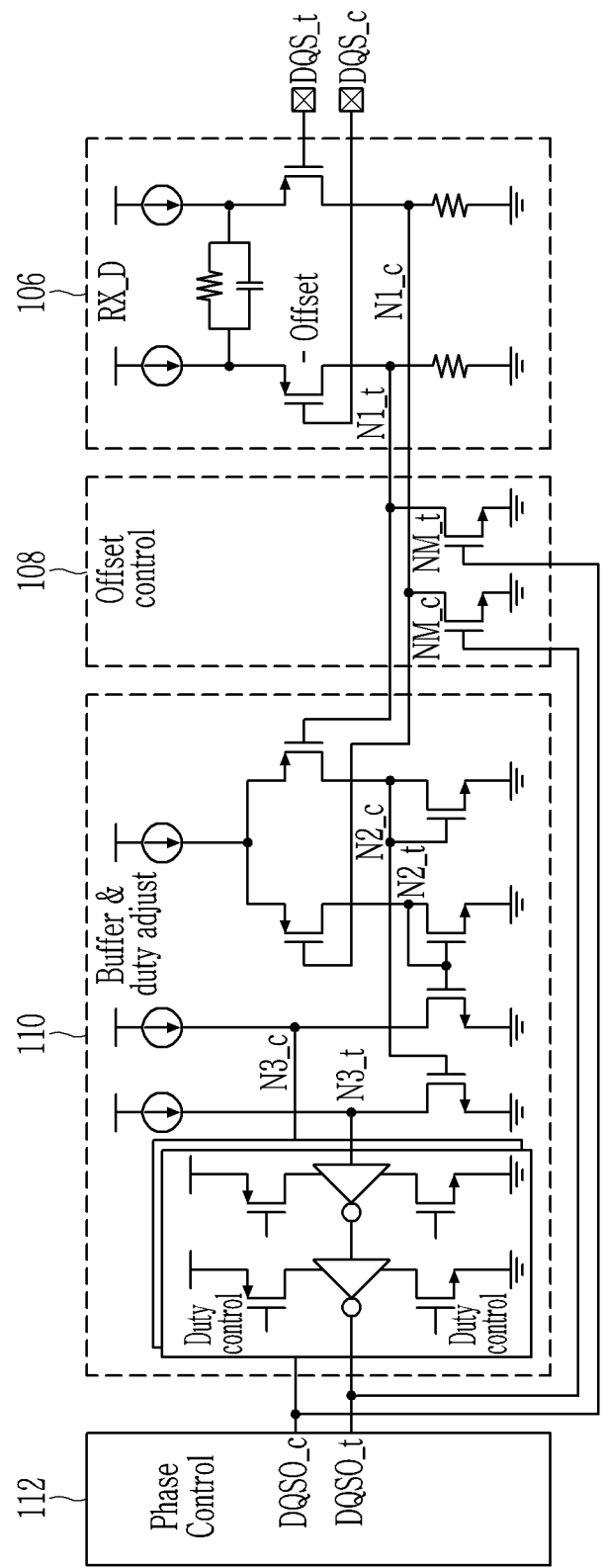
FIG. 3 is a circuit diagram illustrating a memory interface device capable of self-DQS cleaning according to an embodiment of the present disclosure.

FIG. 3 is a circuit diagram illustrating a memory interface device capable of self-DQS cleaning according to an embodiment of the present disclosure.

Referring to FIG. 3, the DQS input buffer 106 may include symmetric transistors forming a differential structure. In addition, the static offset may be provided by setting different sizes of symmetric transistors forming a differential structure in the DQS input buffer 106.

That is, the DQS input buffer 106 may include a first input transistor receiving the first input data strobe signal DQS_t, and a second input transistor receiving the second input data strobe signal DQS_c and forming a differential structure with the first input transistor, and the static offset may be provided by setting different sizes of the first transistor and the second transistor.

The offset control circuit 108 may include two offset control transistors NM_t and NM_c that are turned on according to the clean data strobe signals DQSO_t and DQSO_c to change a dynamic offset. That is, the offset control circuit 108 may include the first offset control transistor NM_t connected to the second input transistor through a first node N1_t, which is turned on to pull down the first node N1_t when the second input data strobe signal DQS_c is high, and a second offset control transistor NM_c connected to the first input transistor through a second node N1_c, which is turned on to pull down the second node N1_c when the first input data strobe signal DQS_t is high.

Since the offset control circuit 108 is implemented with only two transistors, it can hardly affect the area or power consumption of the memory interface device 100, and compared to the offset adjustment technique, which was only applicable to analog circuits through manipulation of the existing current source, it may be applicable to the receiver implemented only with digital circuits.

The duty adjustment buffer 110 may be implemented by adding PMOS and NMOS to an inverter structure, receive signals from the first node N1_t and the second node N1_c and output the clean data strobe signals DQSO_t and DQSO_c. The duty adjustment buffer 110 may adjust a duty error due to the static offset added from the DQS input buffer 106.

The clean data strobe signals DQSO_t and DQSO_c may be provided to gates of the first offset control transistor NM_t and the second offset control transistor NM_c, and the first offset control transistor NM_t may be turned on when a second clean data strobe signal DQSO_c of the clean data strobe signals DQSO_t and DQSO_c is high. The second offset control transistor NM_c may be turned on when the first clean data strobe signal DQSO_t of the clean data strobe signals DQSO_t and DQSO_c is high, the first offset control transistor NM_t may be turned on when the first input data strobe signal DQS_t is low, and the second input data strobe signal DQS_c changes from high to low.

Figure 4:
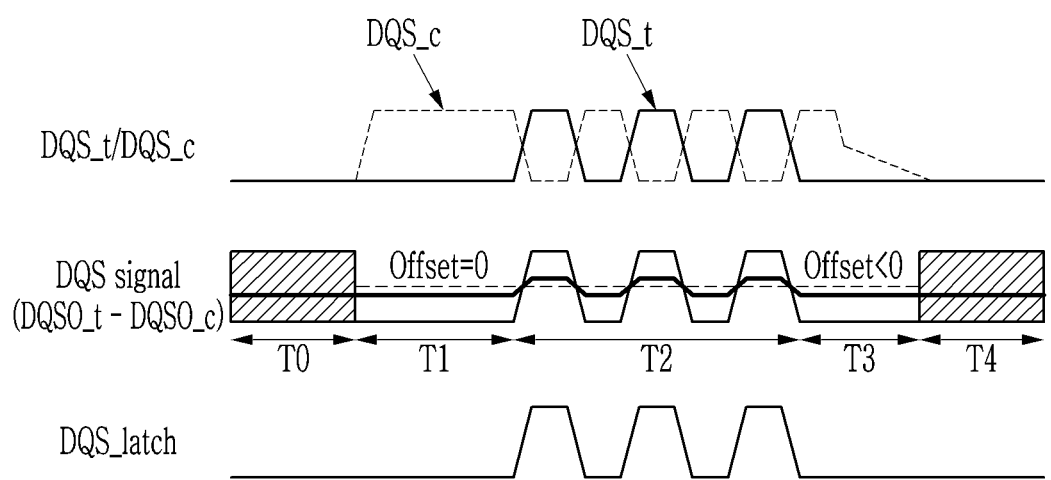
FIG. 4 is a timing diagram illustrating a memory interface device capable of self-DQS cleaning according to an embodiment of the present disclosure.
Figure 5:
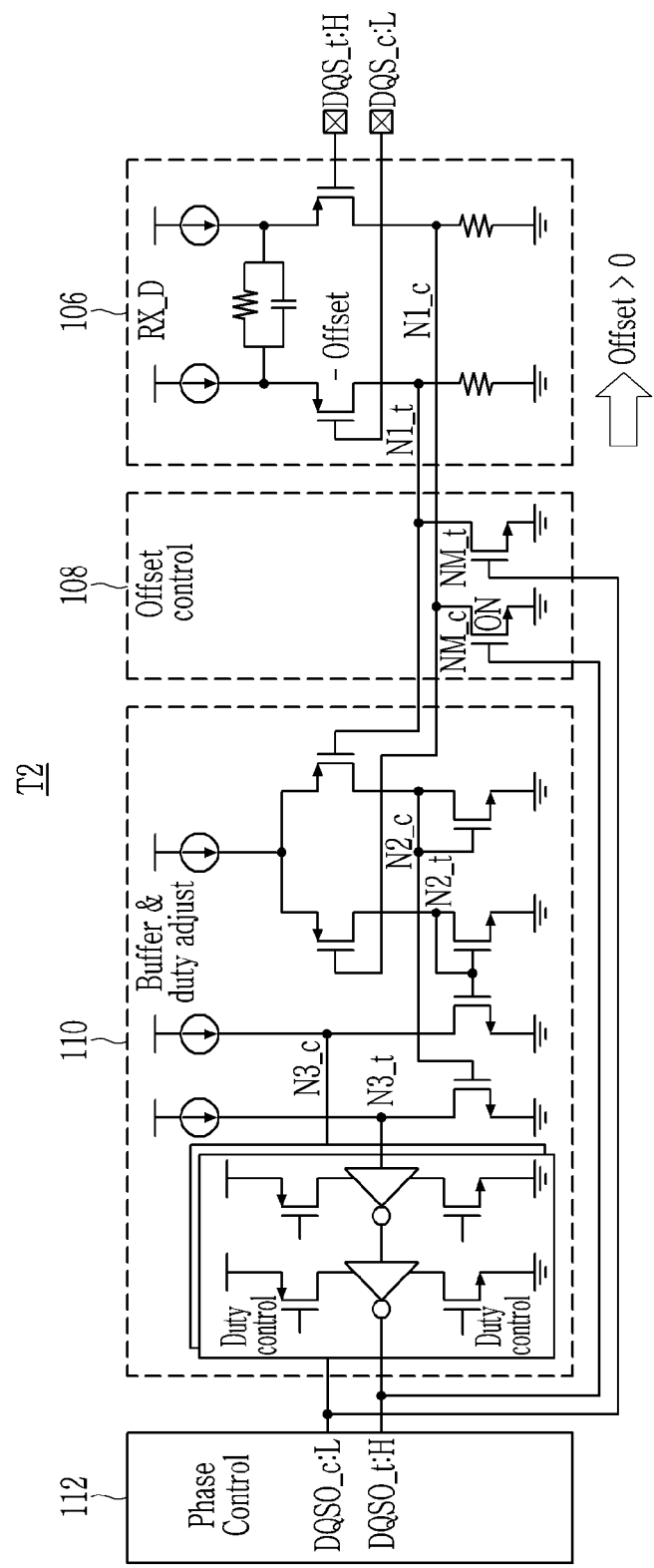
FIG. 5 to FIG. 7 are circuit diagrams for explaining operations of a memory interface device capable of self-DQS cleaning according to an embodiment of the present disclosure.
Figure 6:
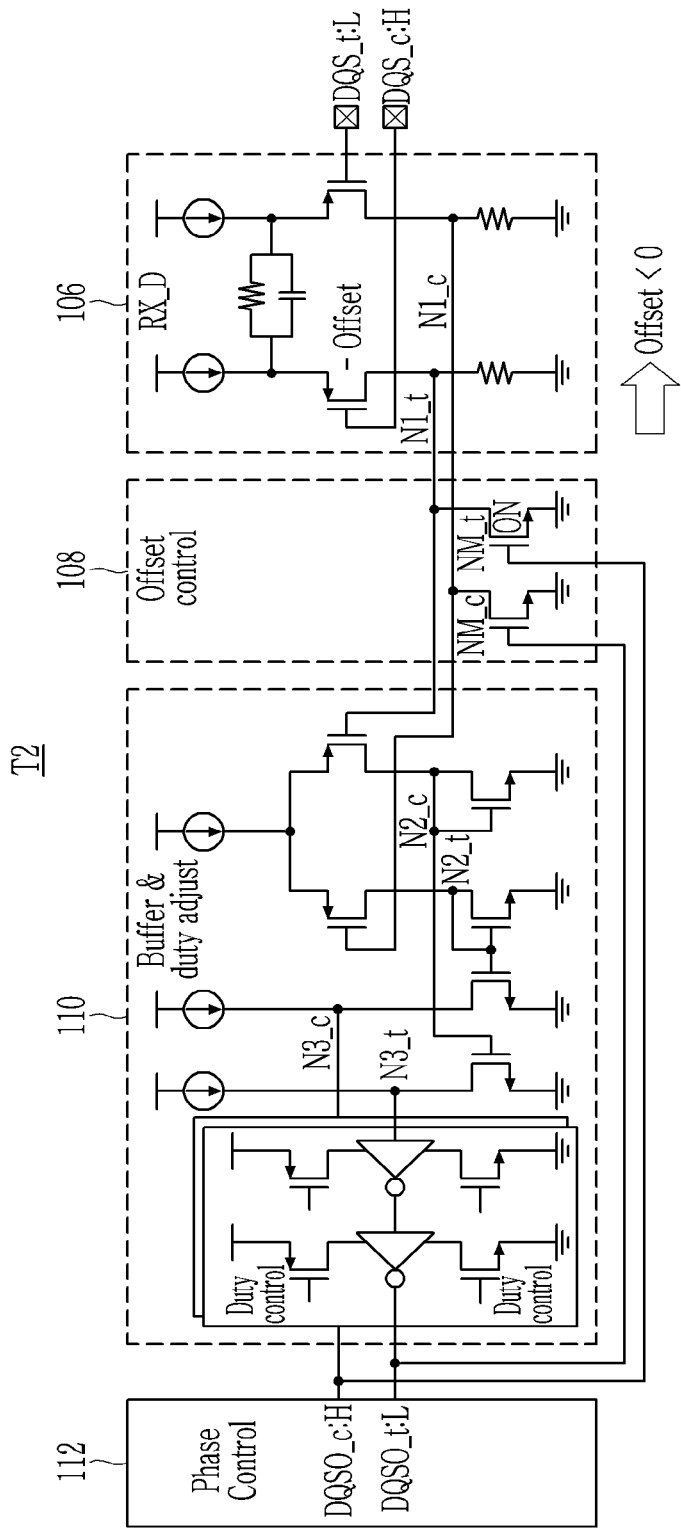
Figure 7:
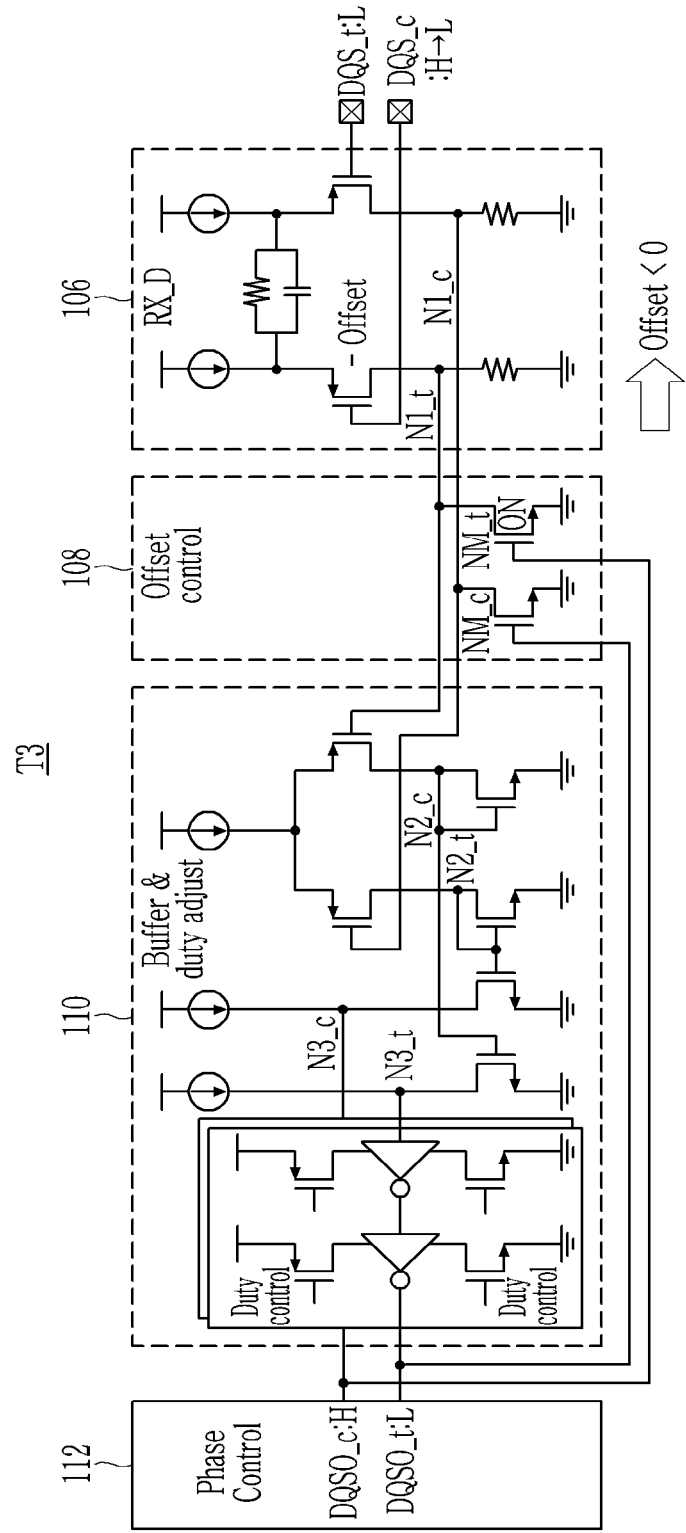

FIG. 4 is a timing diagram illustrating a memory interface device capable of self-DQS cleaning according to an embodiment of the present disclosure, and FIG. 5 to FIG. 7 are circuit diagrams for explaining operations of a memory interface device capable of self-DQS cleaning according to an embodiment of the present disclosure.

Referring to FIG. 4 to FIG. 7, the period of T0 is a period in which the input data strobe signals DQS_t/DQS_c have the same voltage or high impedance. Originally, unwanted pulses are likely to occur in these sections due to external noise or glitches, but since the DQS input buffer 106 provides a negative DC offset, a DQS signal defined as the difference between the clean data strobe signals DQSO_t and DQSO_c may be configured to output 0. The same description as that of the section T0 may be applied to the period of T4.

In the period of T1, the input data strobe signal DQS_c becomes high and the DQS signal maintains 0, and since the input data strobe signal DQS_c is high, a negative offset is also maintained.

In the period of T2, when the input data strobe signal DQS_t becomes high and the input data strobe signal DQS_c becomes low, the DQS signal DQSO_t becomes high, and the offset control transistor NM_c to which the signal is applied is turned on to create a positive offset. Conversely, when the input data strobe signal DQS_t becomes low and the input data strobe signal DQS_c becomes high, the offset control transistor NM_t is turned on and it is converted back to a negative offset.

That is, as shown in FIG. 5, when the first clean data strobe signal DQSO_t of the clean data strobe signals DQSO_t and DQSO_c is high, the second offset control transistor NM_c of the offset control transistors NM_t and NM_c may be turned on. Alternatively, when the first input data strobe signal DQS_t of the input data strobe signals DQS_t and DQS_c is high, the second offset control transistor NM_c of the offset control transistors NM_t and NM_c may be turned on. In this case, the turned-on second offset control transistor NM_c may pull down the second node N1_c of the DQS input buffer 106 to provide a positive dynamic offset.

In addition, as shown in FIG. 6, when the second clean data strobe signal DQSO_c of the clean data strobe signals DQSO_t and DQSO_c is high, the first offset control transistor NM_t of the offset control transistors NM_t and NM_c may be turned on. Alternatively, when the second input data strobe signal DQS_c of the input data strobe signals DQS_t and DQS_c is high, the first offset control transistor NM_t of the offset control transistors NM_t and NM_c may be turned on. In this case, the turned-on first offset control transistor NM_t may pull down the first node N1_t of the DQS input buffer 106 to provide a negative dynamic offset.

The reason for changing the offset according to the output value in this way is to implement a circuit that is robust against noise and glitches by making the duty of the output clock constant and making the threshold voltage (Vth) of "DQS_t–DQS_c" become VDD/2±α instead of VDD/2, like a schmitt trigger circuit.

In the period of T3, the input data strobe signal DQS_t is at low, and only the input data strobe signal DQS_c changes from high to low. The differential signal "DQS_t–DQS_c" should change from a negative value to 0, but in an actual circuit, as soon as DQS_c becomes 0, the value of "Node N1_t–Node N1_c" in FIG. 3 instantaneously has a positive value due to a glitch, a pulse, which is an error component, may be generated. However, in the circuit according to the present embodiment, an error pulse does not occur due to a negative offset (which is the static offset) in the DQS input buffer 106 circuit and a negative offset (which is the dynamic offset) caused by the turn-on of the offset control transistor NM_t.

That is, as shown in FIG. 7, when the first input data strobe signal DQS_t of the input data strobe signals DQS_t and DQS_c is low and the second input data strobe signal DQS_c changes from high to low, the first offset control transistor NM_t of the offset control transistors NM_t and NM_c may be turned on.

Figure 8:
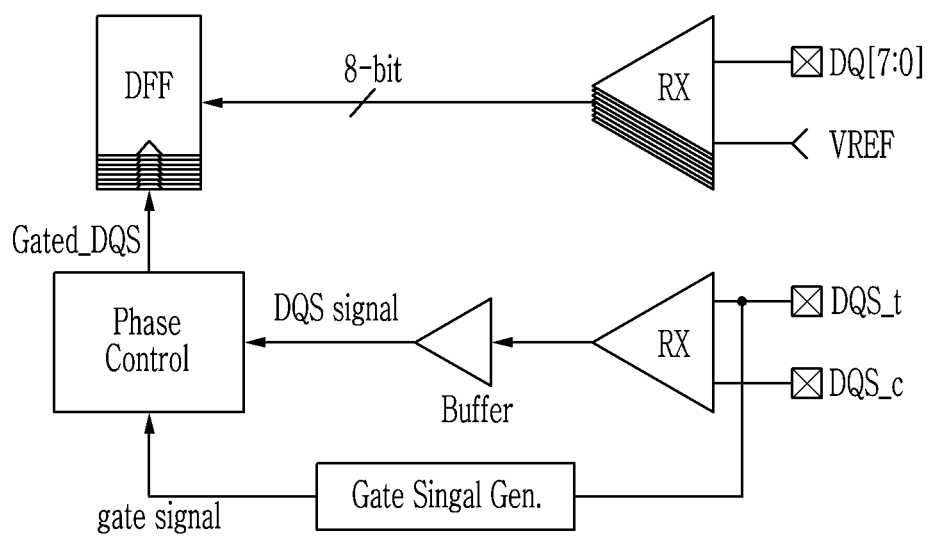
FIG. 8 to FIG. 10 are diagrams for explaining a comparative example in which DQS cleaning is performed using a gate signal.
Figure 9:
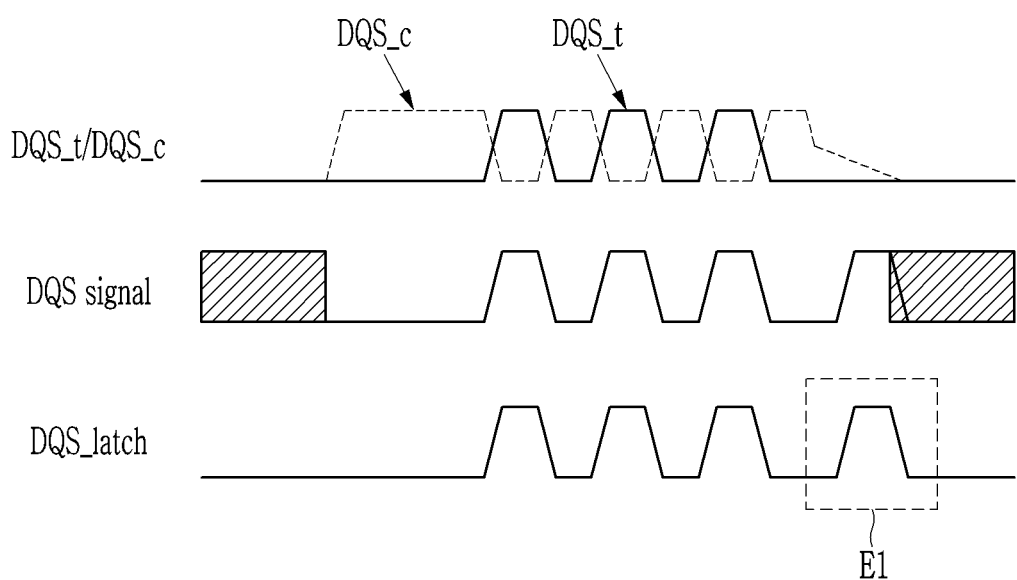
Figure 10:
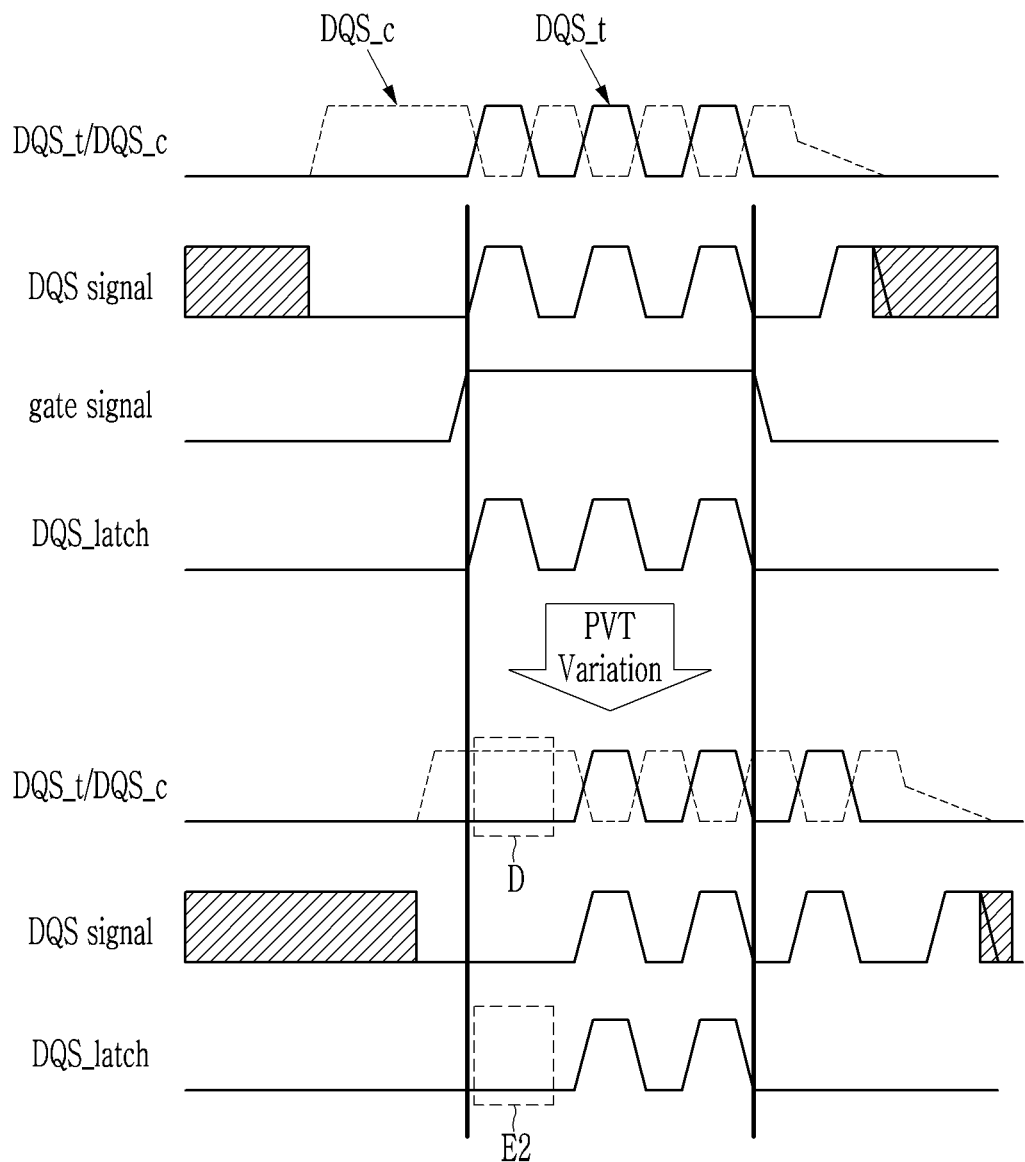

FIG. 8 to FIG. 10 are diagrams for explaining a comparative example in which DQS cleaning is performed using a gate signal.

Referring to FIG. 8, a data input buffer having a single-ended structure, a latch for receiving data, a DQS input buffer having a differential structure for receiving DQS signals, a buffer for converting an analog output to a digital output, a gate signal generator for generating a clean DQS, and a phase control block that adjusts the phase of the restored DQS clock for data capture are shown.

If there is no gate signal generator or correction function for the clean DQS in FIG. 8, the gate signal is not generated, and thus, if DQS is restored as it is, as shown in FIG. 9, DQS_t and DQS_c are set to the same voltage or high impedance from the end of DQS_c, and unwanted glitches or pulses are generated due to small noise or signal fluctuation (see E1).

FIG. 10 is a waveform when a gate signal is generated through correction. A desired waveform such as DQS_latch can be obtained by initially generating a gate signal based on the input DQS_t/DQS_c and then filtering the DQS signal using this. However, after a certain period of time, a delay (see D) of the DQS_t/DQS_c waveform may occur due to changes in the temperature or voltage of the chip, and if the gate signal is kept at the initial setting, the restored DQS_latch will result in a malfunction (see E2). In order to prevent this, if the gate signal is frequently corrected, data transmission is impossible during the correction time, so a black-out time increases and data transmission efficiency decreases.

In the case of generating a gate signal through the conventional gate signal generator as shown in FIG. 8, unlike the method of correcting the gate signal, it is possible to respond to PVT variation (Process-Voltage-Temperature variation) in real time, but there is a problem in that the area and power consumption increase due to the additional circuit. In addition, since the gate signal generator uses only the DQS_t input signal, the load conditions of the DQS_t and DQS_c signals are different, resulting in an unwanted offset, which may cause a duty change.

Figure 11:
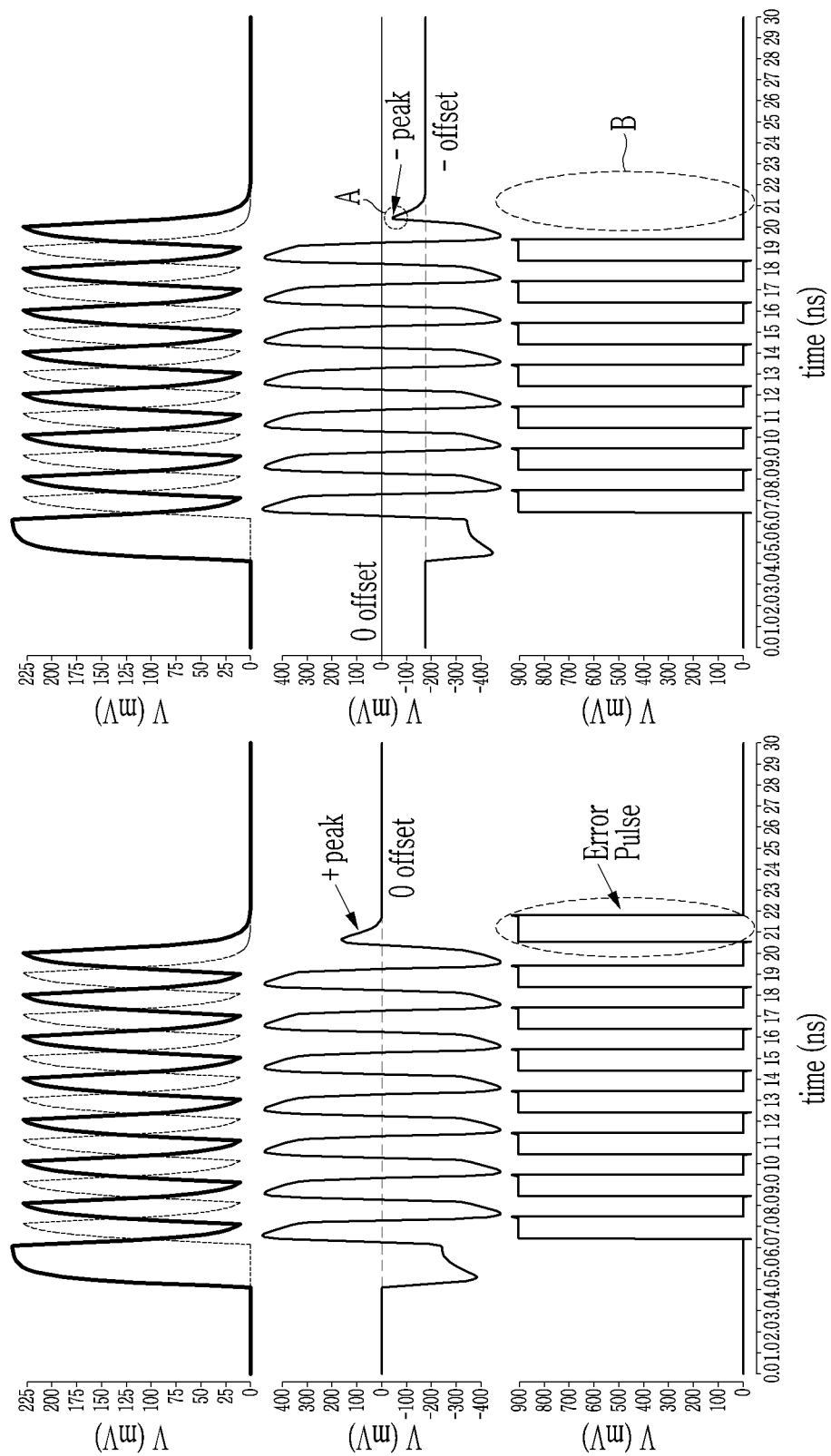
FIG. 11 illustrates a result of comparing a memory interface device capable of self-DQS cleaning with the comparative examples of FIG. 8 to FIG. 10 according to an embodiment of the present disclosure.

FIG. 11 illustrates a result of comparing a memory interface device capable of self-DQS cleaning with the comparative examples of FIG. 8 to FIG. 10 according to an embodiment of the present disclosure.

Referring to FIG. 11, in the case of the left side, it has "+peak" compared to "0 offset" and an "Error Pulse" is generated, whereas in the case of the right side, it has "−peak" compared to "0 offset" and it can be confirmed that "Error Pulse" does not occur, as shown in 'B'.

Figure 12:
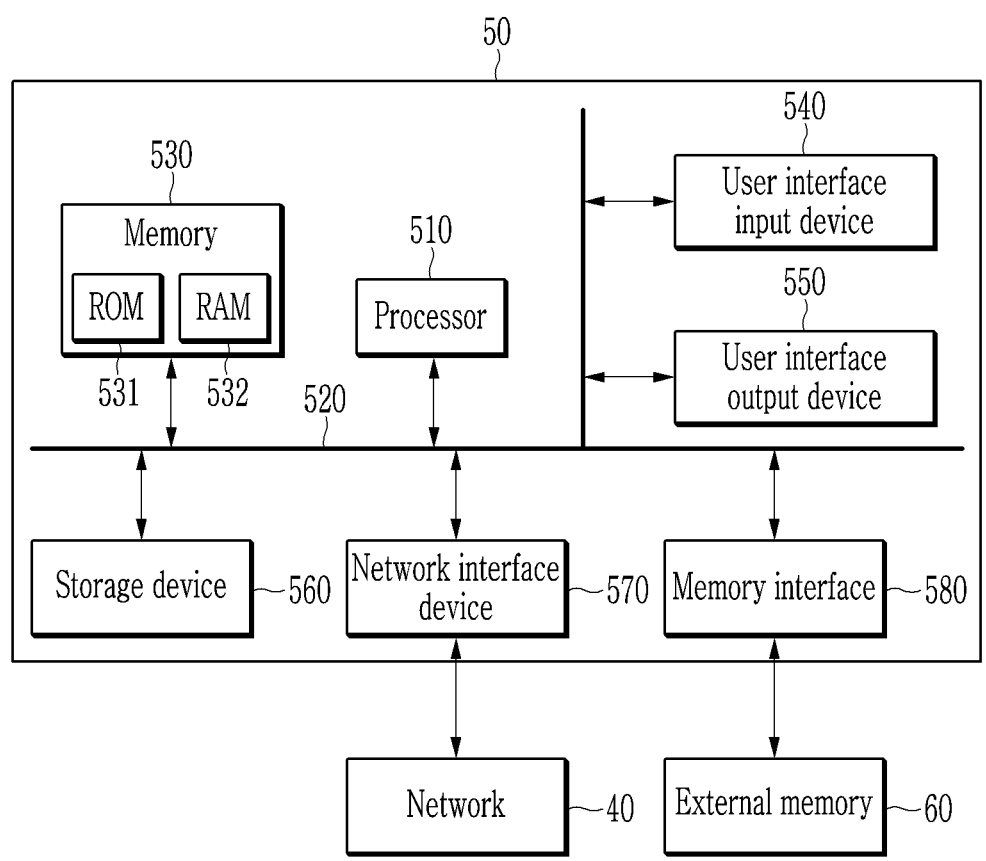
FIG. 12 is a block diagram illustrating a computing device according to an embodiment of the present disclosure.

FIG. 12 is a block diagram illustrating a computing device according to an embodiment of the present disclosure.

Referring to FIG. 12, the computing device 50 includes at least one of a processor 510, a memory 530, a user interface input device 540, a user interface output device 550, and a storage device 560 communicating each other through a bus 520. Computing device 50 may also include network interface 570 electrically connected to network 40. In addition, the computing device 50 may further include a memory interface 580 electrically connected to the external memory 60. The memory interface device according to the above-described embodiments of the present disclosure may be applied to the memory interface 580.

The processor 510 may be implemented in various types such as an application processor (AP), a central processing unit (CPU), a graphic processing unit (GPU), and the like, and may be any device that executes instructions stored in the memory 530 or the storage device 560.

The memory 530 and the storage device 560 may include various types of volatile or non-volatile storage media. For example, the memory may include a read-only memory (ROM) 531 and a random access memory (RAM) 532. In an embodiment of the present disclosure, the memory 530 may be located inside or outside the processor 510, and the memory 530 may be connected to the processor 510 through various known means.

According to the embodiments of the present disclosure described so far, when a DQS signal is high impedance or DQS_t/DQS_c signals are applied to the ground, a self-DQS cleaning circuit that can restore normal DQS pulses by itself is provided so that unintentional pulses do not occur without a separate gate signal or DQS training, as a result, it is simpler than the existing DQS cleaning circuit and does not require additional correction and complicated circuitry, so it is possible to reduce area and power consumption, and to increase data transmission efficiency.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A memory interface device, comprising:
    a DQS input buffer configured to receive input data strobe signals and output first intermediate data strobe signals, the DQS input buffer providing a static offset;
    an offset control circuit configured to receive the first intermediate data strobe signals and output second intermediate data strobe signals; and
    a duty adjustment buffer configured to receive the second intermediate data strobe signals and output clean data strobe signals, wherein
    the offset control circuit provides a dynamic offset using the clean data strobe signals, the offset control circuit includes first and second offset control transistors being turned on according to the clean data strobe signals to change the dynamic offset, and a turned-on offset control transistor of the first and second offset control transistors pulls down a corresponding node of the DOS input buffer to provide a positive or negative dynamic offset, the corresponding node being connected to the turned-on offset control transistor.

2. The memory interface device of claim 1, wherein:
when a first clean data strobe signal of the clean data strobe signals is high, the second offset control transistor is turned on.

3. The memory interface device of claim 1, wherein:
when a second clean data strobe signal of the clean data strobe signals is high, the first offset control transistor is turned on.

4. The memory interface device of claim 1, wherein:
when a first input data strobe signal of the input data strobe signals is high, the second offset control transistor is turned on.

5. The memory interface device of claim 4, wherein:
the turned-on second offset control transistor pulls down a second node of the DQS input buffer to provide a positive dynamic offset.

6. The memory interface device of claim 1, wherein:
when a second input data strobe signal of the input data strobe signals is high, the first offset control transistor is turned on.

7. The memory interface device of claim 6, wherein:
the turned-on first offset control transistor pulls down a first node of the DQS input buffer to provide a negative dynamic offset.

8. The memory interface device of claim 6, wherein:
when a first input data strobe signal of the input data strobe signals is low, and the second input data strobe signal changes from high to low, the first offset control transistor is turned on.

9. The memory interface device of claim 1, wherein:
the static offset is a direct current (DC) offset.

10. The memory interface device of claim 1, wherein:
the static offset is provided by setting different sizes of symmetric transistors forming a differential structure in the DQS input buffer.

11. The memory interface device of claim 1, wherein:
the input data strobe signals are differential data strobe signals.

12. The memory interface device of claim 1, wherein:
the duty adjustment buffer adjusts a duty error due to the static offset.

* * * * *